(12) United States Patent
Ishii et al.

(10) Patent No.: US 9,730,324 B2
(45) Date of Patent: Aug. 8, 2017

(54) VARIABLE CAPACITANCE DEVICE AND ANTENNA DEVICE

(71) Applicant: TAIYO YUDEN CO., LTD., Tokyo (JP)

(72) Inventors: Daiki Ishii, Tokyo (JP); Kentaro Morito, Tokyo (JP); Tomokazu Ikenaga, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 172 days.

(21) Appl. No.: 14/833,946

(22) Filed: Aug. 24, 2015

(65) Prior Publication Data

US 2016/0064148 A1   Mar. 3, 2016

(30) Foreign Application Priority Data

Aug. 29, 2014  (JP) ................................ 2014-174804

(51) Int. Cl.
*H01G 7/06*  (2006.01)
*H05K 1/16*  (2006.01)

(52) U.S. Cl.
CPC ............. *H05K 1/162* (2013.01); *H01G 7/06* (2013.01); *H05K 2201/10098* (2013.01)

(58) Field of Classification Search
CPC ....................................................... H01G 7/06
See application file for complete search history.

(56) References Cited

U.S. PATENT DOCUMENTS

| 6,100,773 A * | 8/2000 | Nakamichi | H03H 7/38 333/32 |
| 2004/0164819 A1 | 8/2004 | Mishima et al. | |
| 2009/0310275 A1* | 12/2009 | Katta | H01G 5/16 361/277 |
| 2010/0020469 A1* | 1/2010 | Kurioka | H01G 4/018 361/321.1 |
| 2011/0134582 A1 | 6/2011 | Kanno | |

FOREIGN PATENT DOCUMENTS

| JP | 2004-207630 A | 7/2004 |
| JP | 2008-66682 A | 3/2008 |
| JP | 2011-119482 A | 6/2011 |

* cited by examiner

*Primary Examiner* — Eric Thomas
(74) *Attorney, Agent, or Firm* — Chen Yoshimura LLP

(57) ABSTRACT

A variable capacitance device includes: a supporting substrate having a plurality of variable capacitance elements formed thereon, the plurality of variable capacitance elements being connected in series, wherein each of the plurality of variable capacitance elements has a separate lower electrode, or at least some of the plurality of variable capacitance elements share a lower electrode, thereby forming a plural set of the lower electrodes that serves as the lower electrodes of the respective variable capacitance elements, wherein the variable capacitance device further includes an insulating moisture-resistant film and a conductive adhesive film, and wherein the conductive adhesive film and the insulating moisture-resistant film have a gap in a plan view between at least some of regions where the plural set of the lower electrodes are respectively formed so as to avoid electrical leakage between said at least some of regions through the conductive adhesive film.

3 Claims, 7 Drawing Sheets

VARIABLE CAPACITANCE DEVICE AND ANTENNA DEVICE

BACKGROUND OF THE INVENTION

Technical Field

The present invention relates to a variable capacitance device and an antenna device that utilizes the variable capacitance device.

Background Art

In NFC (near field communication) modules used for mobile FeliCa, a phenomenon has been known to occur in which reception sensitivity decreases as a result of the resonant frequency shifting away from 13.56 MHz due to variations in the antenna coil, for example. To correct these shifts in the resonant frequency, frequency adjustment circuits that include capacitors are placed inside the modules, all parts are inspected before the modules are shipped, and the capacitance of the capacitors is minutely adjusted.

Conventionally, switched capacitors, in which FET (field effect transistor) switches are connected in series in a fixed capacitance element, have been used. Switchover settings are then written onto a control IC (integrated circuit) during the pre-shipping inspection, and when NFC is being used, the module switches over to the FET mode and minutely adjusts the capacitance of the capacitor.

However, general-purpose ceramic capacitors, which have become cheaper than FET switches in recent years and which can handle high voltages, have been considered as a possible replacement for FET switches. Ceramic capacitor materials have a property that has been actively utilized: the capacitance decreases as a DC bias voltage is applied.

The capacitance of ceramic capacitors changes over time when bias voltage is applied, however, which is a problem. This has led to consideration of using variable capacitance devices that utilize a plurality of variable capacitance elements that are connected in series and that include a dielectric layer formed via a thin film instead of by sintering.

When creating such a variable capacitance device, it is preferable that variable capacitance elements and resistors be formed upon the same substrate. As part of this process, an insulating moisture-resistant film and a conductive adhesive film are formed on the variable capacitance element portion of the device in order to keep the device moisture resistant. There have been mechanical reliability issues and current leakage problems in such devices, however, depending on certain factors. These factors include the relationship between the insulating moisture-resistant film and an interlayer insulation layer formed on the insulating moisture-resistant film, as well as the properties of the conductive adhesive film.

RELATED ART DOCUMENTS

Patent Documents

Patent Document 1: Japanese Patent Application Laid-Open Publication No. 2011-119482
Patent Document 2: Japanese Patent Application Laid-Open Publication No. 2008-66682
Patent Document 3: Japanese Patent Application Laid-Open Publication No. 2004-207630

SUMMARY OF THE INVENTION

Accordingly, the present invention is directed to a variable capacitance device and antenna device that substantially obviate one or more of the problems due to limitations and disadvantages of the related art.

An object of the present invention is to provide a relatively simple and effective way and structure to prevent current leakage in and increase the mechanical reliability of a variable capacitance device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a variable capacitance device, including: a supporting substrate having a plurality of variable capacitance elements formed thereon, the plurality of variable capacitance elements being connected in series, wherein each of the plurality of variable capacitance elements includes: a lower electrode formed over the supporting substrate; a dielectric formed on the lower electrode; and an upper electrode formed on the dielectric, wherein each of the plurality of variable capacitance elements has a separate lower electrode, or at least some of the plurality of variable capacitance elements share a lower electrode, thereby forming a plural set of the lower electrodes that serves as the lower electrodes of the respective variable capacitance elements, wherein the variable capacitance device further includes an insulating moisture-resistant film and a conductive adhesive film that are formed after the upper electrodes for the respective variable capacitance elements have been formed, whereby the insulating moisture-resistant film and the conductive adhesive film are in layers that are positioned at a level higher than a layer in which the upper electrodes are formed, and wherein the conductive adhesive film and the insulating moisture-resistant film have a gap in a plan view between at least some of regions where the plural set of the lower electrodes are respectively formed so as to avoid electrical leakage between said at least some of regions through the conductive adhesive film.

Using a variable capacitance device with such a configuration prevents current leakage from occurring between lower electrode regions.

In addition, the variable capacitance device described above may be configured so as to further include an insulating layer formed on the insulating moisture-resistant film, and the insulating layer may contact a top surface of the supporting substrate at the gap of the conductive adhesive film and the insulating moisture-resistant film.

The above-described variable capacitance device may be used in an antenna device. This would allow for the creation of a higher quality antenna device.

A detailed explanation of the configuration mentioned above will be made in the following embodiments, but the invention itself is not limited to the embodiments.

According to at least some aspects of the present invention, problems related to a moisture-resistant film, which is formed at the same time that variable capacitance elements connected in series are formed in a film, can be resolved.

It is to be understood that both the foregoing general description and the following detailed description are exemplary and explanatory, and are intended to provide further explanation of the invention as claimed.

DETAILED DESCRIPTION OF EMBODIMENTS

Figure 1:
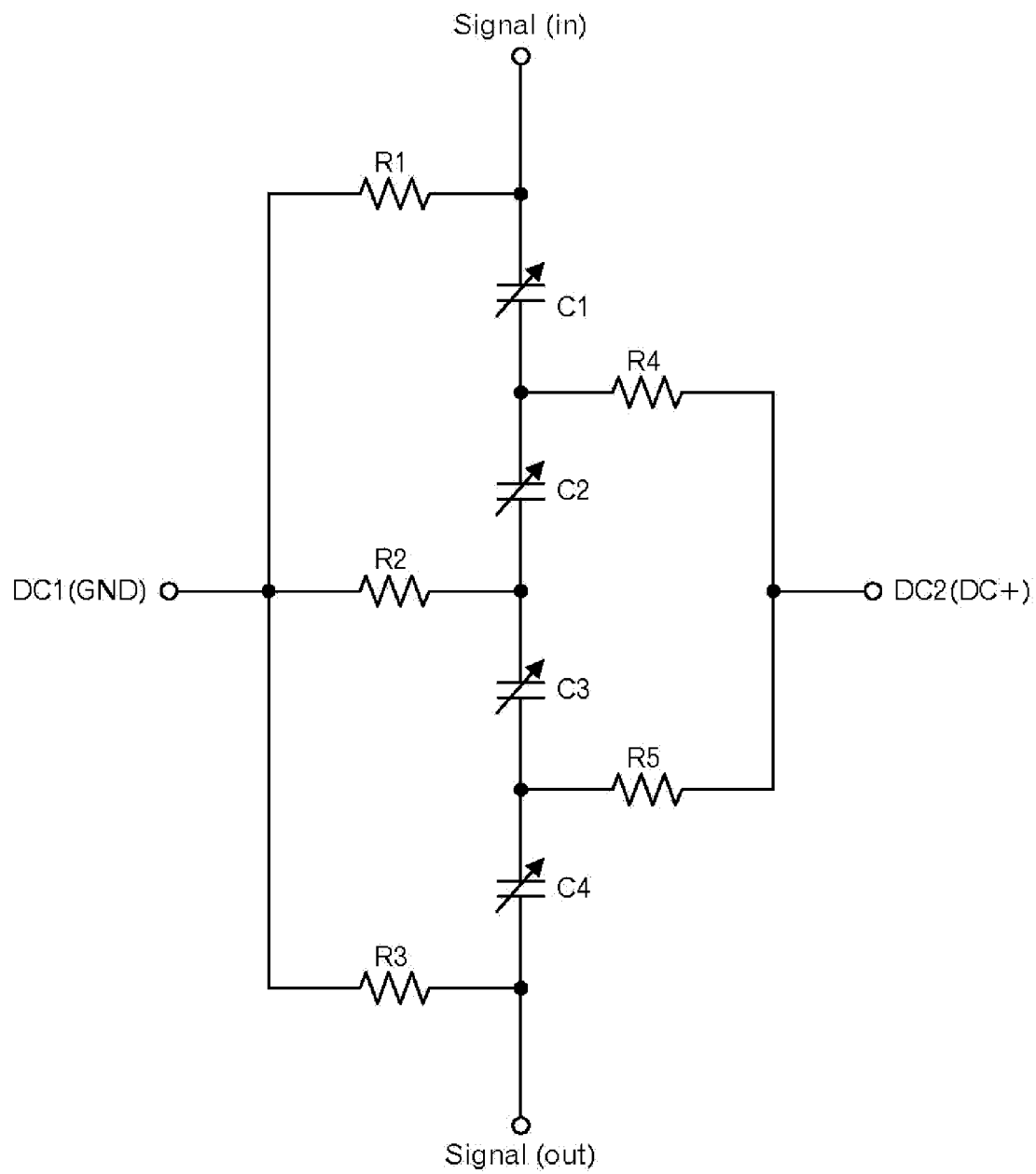
FIG. 1 illustrates an example of a circuit configuration of a variable capacitance device according to an embodiment of the present invention.

FIG. 1 shows an example of a circuit formed in a variable capacitance device according to an embodiment of the present invention. In the variable capacitance device shown in FIG. 1, a variable capacitance array containing variable capacitance elements C1 to C4 is connected in series from a high frequency signal input terminal (Signal(in)) to a high frequency signal output terminal (Signal(out)). In addition, for each of the variable capacitance elements C1 to C4 in the variable capacitance array, one end is connected to a ground terminal DC1 via resistors R1 to R3, and the other end is connected to a control voltage application terminal DC2 via resistors R4 and R5. The capacitance of the variable capacitance elements C1 to C4 in the variable capacitance array changes in accordance with voltage applied between the terminals DC2 and DC1.

Figure 2:
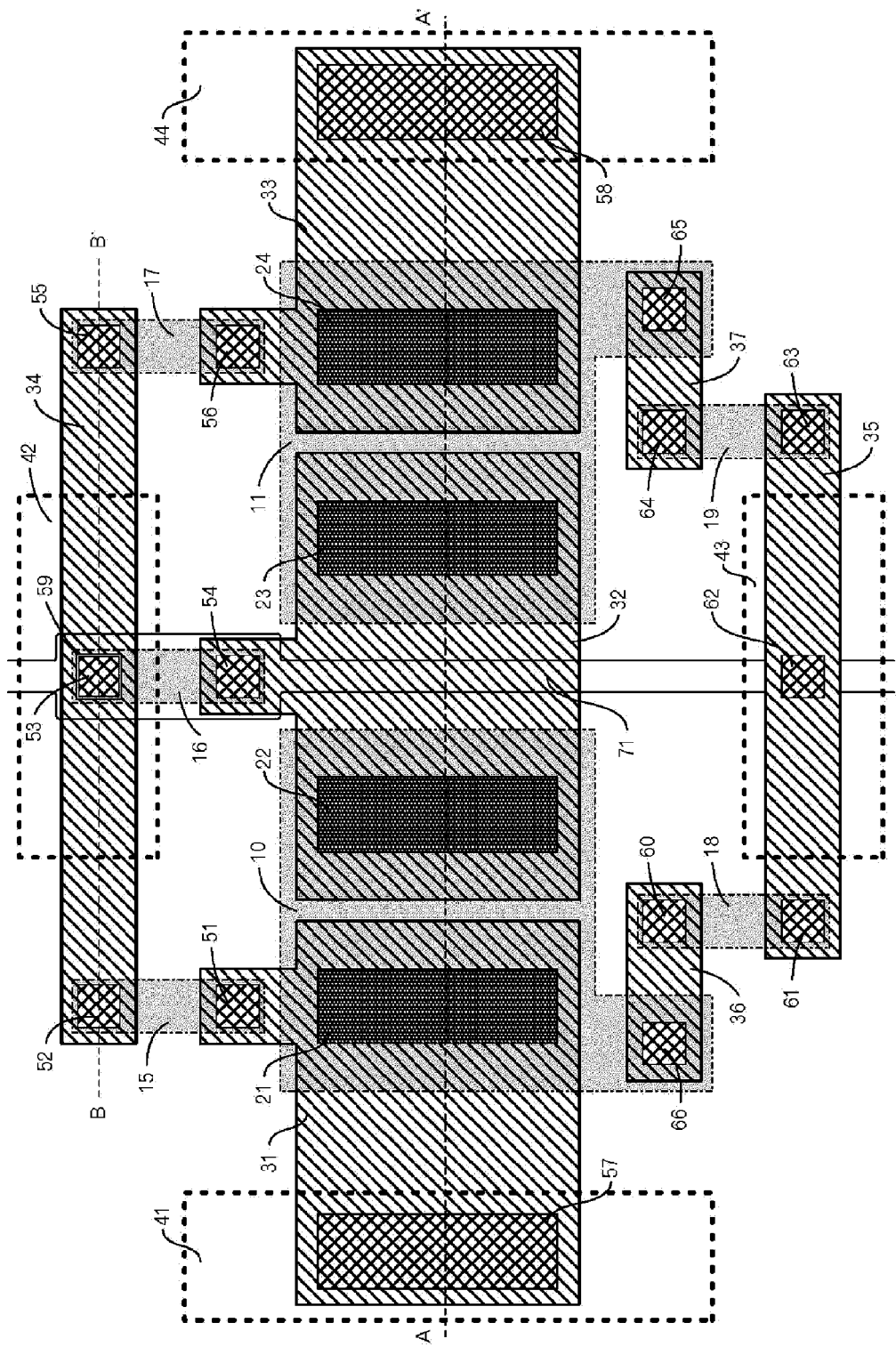
FIG. 2 is a transparent top view of a basic configuration of a variable capacitance device according to the embodiment of the present invention shown in FIG. 2.
Figure 4:
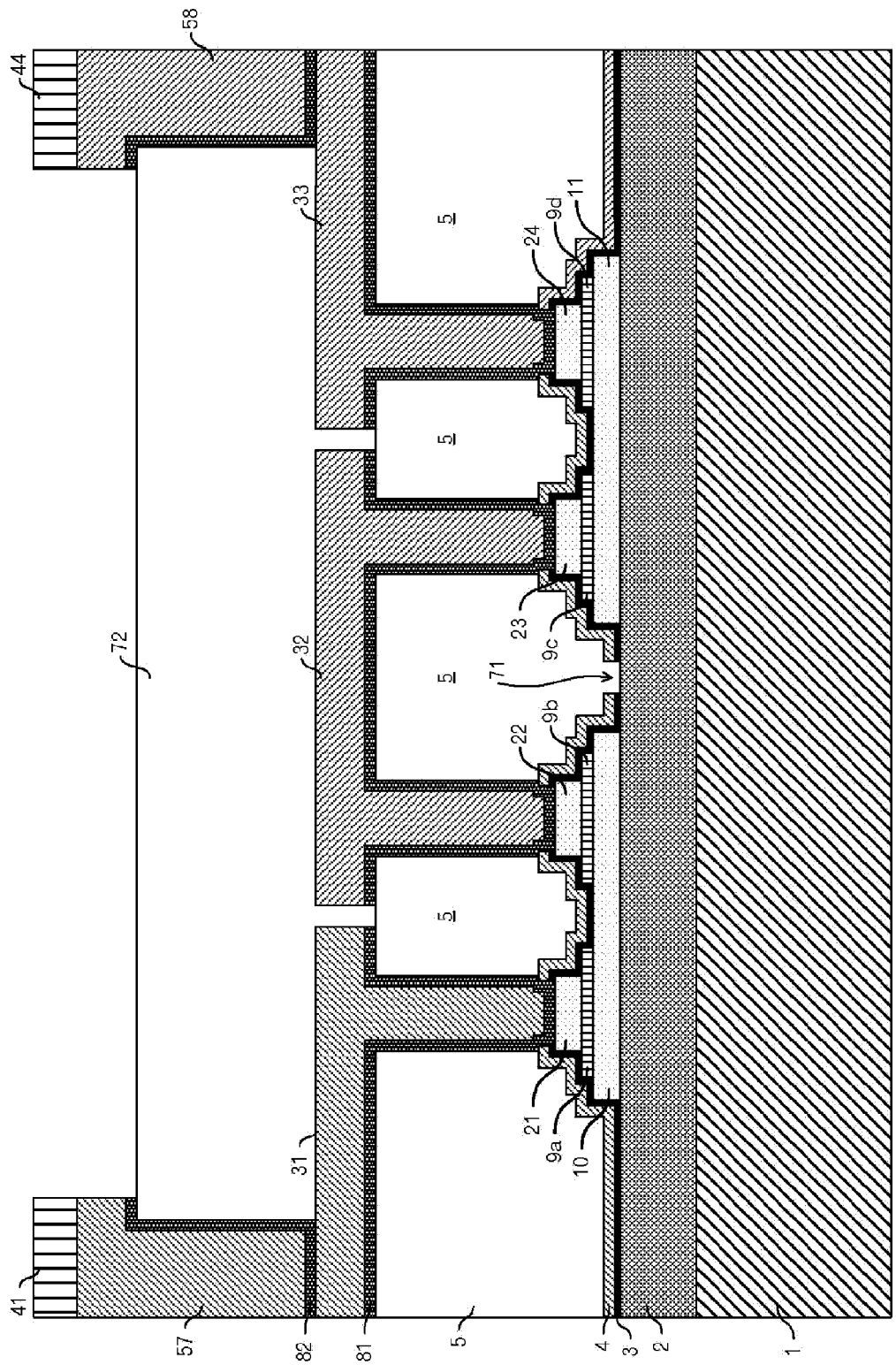
FIG. 4 is a cross-section of the variable capacitance device of FIG. 2, taken along the line A-A' of FIG. 2.
Figure 5:
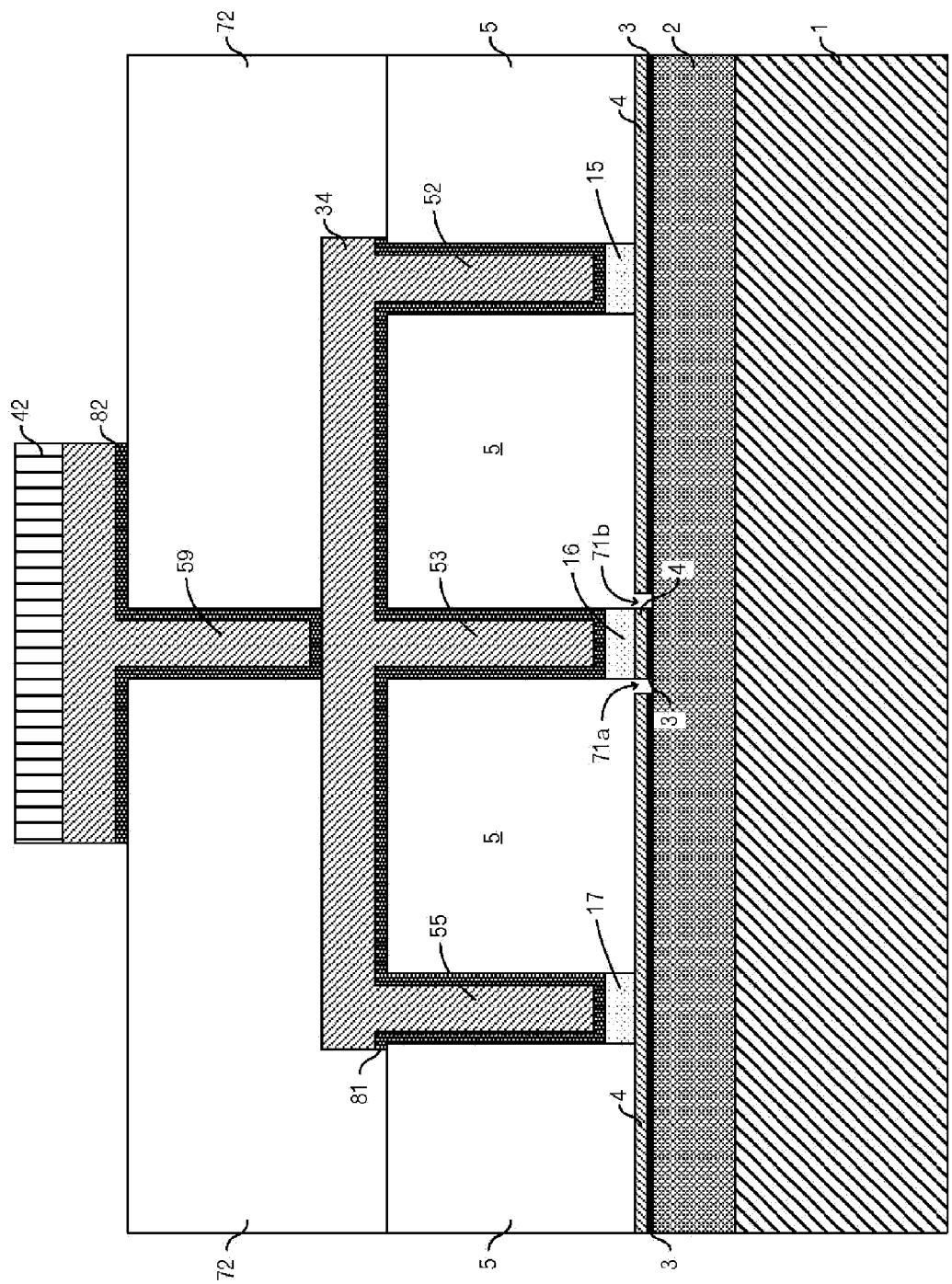
FIG. 5 is another cross-section of the variable capacitance device of FIG. 2, taken along the line B-B' of FIG. 2.

FIG. 2 is a transparent top view showing a basic configuration of the variable capacitance device of FIG. 1 in the case that the device is formed of thin films. FIG. 4 is a cross-section of the variable capacitance device of FIG. 2, taken along the line A-A' of FIG. 2. FIG. 5 is another cross-section of the variable capacitance device of FIG. 2, taken along the line B-B' of FIG. 2.

On a supporting substrate (1 in FIG. 4), lower electrode layers 10, 11 are formed for two variable capacitance elements, respectively. The variable capacitance elements C4 and C3 are created by forming a dielectric layer (9a in FIG. 4) and an upper electrode layer 21, and a dielectric layer (9b in FIG. 4) and an upper electrode layer 22, on the lower electrode layer 10. In a similar manner, the variable capacitance elements C2 and C1 are created by forming a dielectric layer (9c in FIG. 4) and an upper electrode layer 23, and a dielectric layer (9d in FIG. 4) and an upper electrode layer 24, on the lower electrode layer 11. Resistance layers 15 to 19, which correspond to resistors R1 to R5 in FIG. 1, are formed on an insulating moisture-resistant film (4 in FIG. 4) and a conductive adhesive film (3 in FIG. 4), both of which will be discussed later.

A conductive layer 31 corresponding to a wiring layer is formed on the upper electrode layer 21. A conductive layer 57 that corresponds to a wiring layer is formed on the conductive layer 31 at an opening in an interlayer insulation layer (72 in FIG. 4). The conductive layer 57 is connected to a terminal electrode 41 that corresponds to a high frequency signal output terminal. A conductive layer 32 that corresponds to a wiring layer is formed on the upper electrode layer 22 and the upper electrode layer 23. A conductive layer 33 corresponding to a wiring layer is formed on the upper electrode layer 24. A conductive layer 58 that corresponds to a wiring layer is formed on the conductive layer 33 at an opening in the interlayer insulation layer (72 in FIG. 4). The conductive layer 58 is connected to a terminal electrode 44 that corresponds to a high frequency signal input terminal.

Conductive layers 51, 52 that correspond to wiring layers are formed on the resistance layer 15 at an opening in an interlayer insulation layer (5 in FIG. 4). The resistance layer 15 is connected to the conductive layer 31 and a conductive layer 34 that corresponds to a wiring layer. In a similar manner, conductive layers 54, 53 that correspond to wiring layers are formed on the resistance layer 16 at an opening in the interlayer insulation layer (5 in FIG. 4). The resistance layer 16 is connected to the conductive layer 32 and the conductive layer 34. Conductive layers 56, 55 that correspond to wiring layers are formed on the resistance layer 17 at an opening in the interlayer insulation layer (5 in FIG. 4). The resistance layer 17 is connected to the conductive layers 33, 34. A conductive layer 59 that corresponds to a wiring layer is formed on the conductive layer 34 at an opening in the interlayer insulation layer (72 in FIG. 4). The conductive layer 59 is connected to a terminal electrode 42 that corresponds to the terminal DC1 that is connected to the ground.

A conductive layer 66 that corresponds to a wiring layer is formed on the lower electrode layer 10 at an opening in the interlayer insulation layer (5 in FIG. 4), and a conductive layer 36 that corresponds to a wiring layer is formed on the conductive layer 66. Meanwhile, a conductive layer 60 that corresponds to a wiring layer is formed on the resistance layer 18 at an opening in the interlayer insulation layer (5 in FIG. 4), and the conductive layer 36 is formed on the conductive layer 60.

In a similar manner, a conductive layer 65 that corresponds to a wiring layer is formed on the lower electrode layer 11 at an opening in the interlayer insulation layer (5 in FIG. 4), and a conductive layer 37 that corresponds to a wiring layer is formed on the conductive layer 65. Meanwhile, a conductive layer 64 that corresponds to a wiring layer is formed on a resistance layer 19 at an opening in the interlayer insulation layer (5 in FIG. 4), and the conductive layer 37 is formed on the conductive layer 64.

Furthermore, a conductive layer 61 that corresponds to a wiring layer is formed on the resistance layer 18 at an opening in the interlayer insulation layer (5 in FIG. 4), and a conductive layer 35 that corresponds to a wiring layer is formed on the conductive layer 61. A conductive layer 63 that corresponds to a wiring layer is formed on the resistance layer 19 at an opening in the interlayer insulation layer (5 in FIG. 4), and a conductive layer 35 is formed on the conductive layer 63. A conductive layer 62 that corresponds to a wiring layer is formed on the conductive layer 35, and the conductive layer 62 is connected to a terminal electrode 43 that corresponds to the control voltage application terminal DC2.

In this embodiment, in order to increase the moisture-resistance of the variable capacitance elements formed via the lower electrode layers, the dielectric layers, and the upper electrode layers, a conductive adhesive film (3 in FIG. 4) and an insulating moisture-resistant film (4 in FIG. 4) are provided. To form these patterned films, layers for forming these films are successively deposited on the entire surface of the supporting substrate after the upper electrode layers 21 to 24 are formed. Then, portions of the deposited layers that should be opened to allow the upper electrode layers 21 to 24 to be connected to conductive layers which are to be formed on the upper electrode layers, respectively, are removed via plasma etching or the like.

Figure 3:
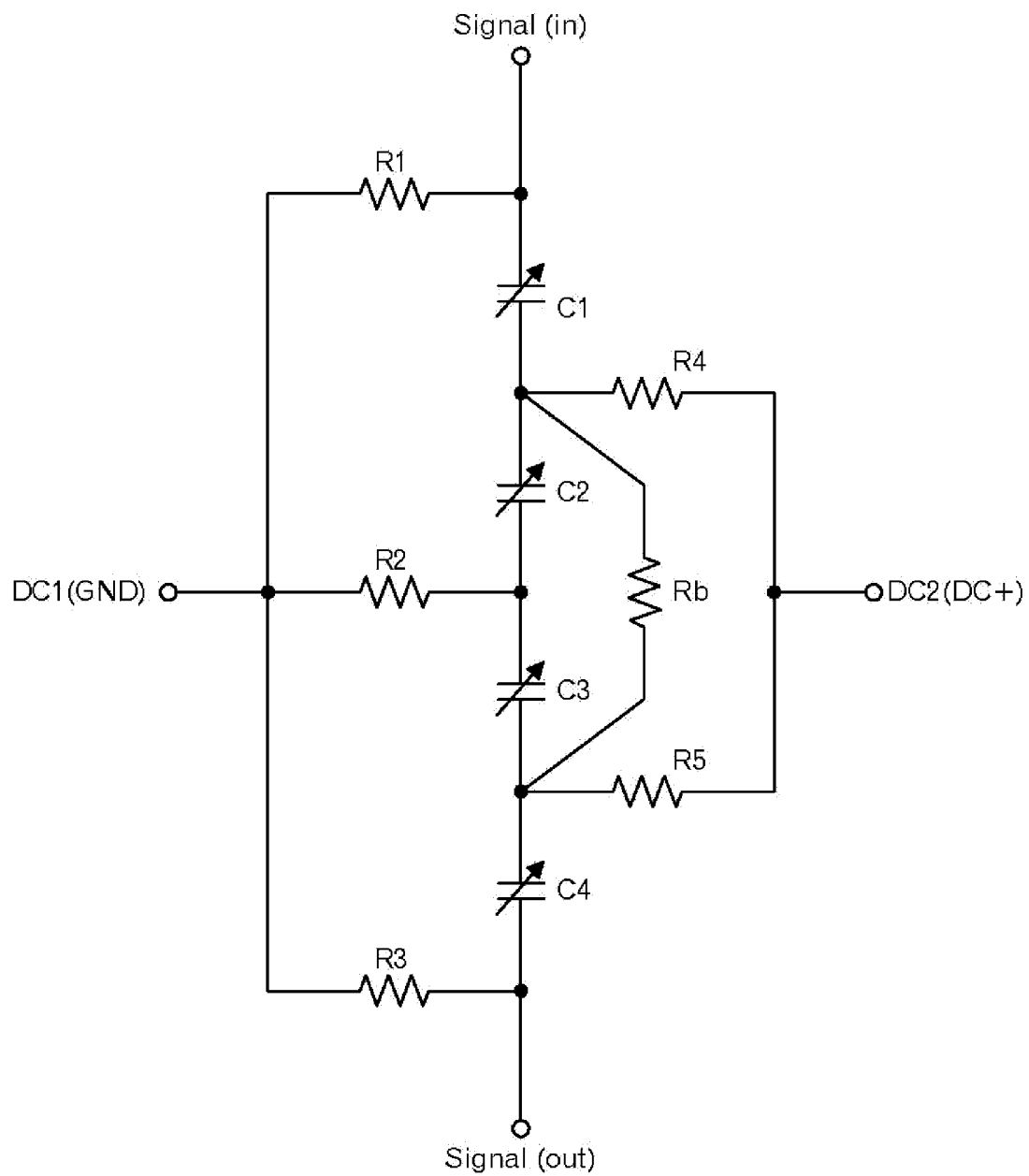
FIG. 3 shows an equivalent circuit of a variable capacitance device in which leaks occur.

With this configuration, the mechanical reliability of the device may decrease since there is poor adhesion between the insulating moisture-resistant film 4 and the interlayer insulation layer 5, which is to be formed after the formation of the conductive adhesive film 3 and the insulating moisture-resistant film 4, and which functions as a protective layer for the variable capacitance elements. In addition, the conductivity of the conductive adhesive film 3, which increases the adhesion of the insulating moisture-resistant film 4 with respect to the variable capacitance elements and the substrate, may cause leaks to occur between the lower electrode layer 10 and the lower electrode layer 11, which would lead to a decrease in the Q factor. In terms of a circuit, as shown in FIG. 3, this means that there exists a resistor Rb that connects the terminal on the input terminal side of the capacitor C2 with the terminal on the output terminal side of the capacitor C3, which is undesirable.

Thus, in one aspect of the present embodiment, a slit 71, as shown in FIG. 2, is formed by removing respective portions of the insulating moisture-resistant film 4 and the conductive adhesive film 3 that are located between the lower electrode layer 10 and the lower electrode layer 11. This removal is performed by plasma etching or the like. The slit 71 separates the conductive adhesive film 3 into two regions: a first region (left-hand side) that contacts the lower electrode layer 10 and a second region (right-hand side) that contacts the lower electrode layer 11. The slit 71 also separates the insulating moisture-resistant film 4 into two regions: a first region (left-hand side) that is formed on the first region of the conductive adhesive film 3 and a second region (right-hand side) that is formed on the second region of the conductive adhesive film 3. Moreover, the slit 71 extends to an area on the supporting substrate where the resistance layer 16 is formed in order to further prevent leaks. A shown in FIG. 2, in the area where the resistance layer 16 is formed, the slit 71 separates the insulating moisture-resistant film 4 and the conductive adhesive film 3 into respective first regions and second regions. A slit of any shape can be used as the slit 71 as long as the slit is able to electrically separate the lower electrode layer 10 and the lower electrode layer 11.

With the above-described configuration, leaks between the lower electrode layer 10 and the lower electrode layer 11 through the conductive adhesive film are prevented from occurring. Further, the interlayer insulation layer 5 to be formed on the insulating moisture-resistant film 4 contacts the supporting substrate at the slit. Therefore, adhesion of the interlayer insulation layer 5 to the substrate is improved.

Next, the cross section A-A' in FIG. 2 will be explained in more detail using FIG. 4.

A thermal oxide film 2 that is made of $SiO_2$ is formed on a surface of the supporting substrate 1, which may be made of silicon, for example. The supporting substrate 1 may also be a conductive substrate (preferably a high-resistance substrate) with an insulating layer film thereon or an insulating substrate made of quartz, alumina, sapphire, glass, or the like, instead of the silicon substrate. The silicon substrate 1 has a thickness of 400 µm, for example, and the $SiO_2$ film 2 has a thickness of 1 µm, for example.

The lower electrode layers 10, 11 are formed on the thermal oxide film 2 (this may be done via an adhesive layer (made of Ti or $TiO_2$, for example)). The lower electrode layers 10, 11 are made of a noble metal such as Pt, Ir, or Ru, or a conductive oxide such as $SrRuO_3$, $RuO_2$, or $IrO_2$, for example. The thickness of the lower electrode layers 10, 11 is 250 nm, for example.

The dielectric layers 9a, 9b are formed on the lower electrode layer 10, and the dielectric layers 9c, 9d are formed on the lower electrode layer 11. The dielectric layers 9a to 9d are made of BST ($BaSrTiO_3$), PZT ($PbZrTiO_3$), another oxide with a perovskite structure, or the like, to which a trace amount of Mn has been added, for example. The thickness of the dielectric layers 9a to 9d is 100 nm, for example.

Furthermore, the upper electrode layer 21 is formed on the dielectric layer 9a, the upper electrode layer 22 is formed on the dielectric layer 9b, the upper electrode layer 23 is formed on the dielectric layer 9c, and the upper electrode layer 24 is formed on the dielectric layer 9d. The upper electrode layers 21 to 24 are, similar to the lower electrode layers 10, 11, made of a noble metal such as Pt, Ir, or Ru, or a conductive oxide such as $SrRuO_3$, $RuO_2$, or $IrO_2$. The thickness of the upper electrode layers 21 to 24 is 250 nm, for example.

After the upper electrode layers 21 to 24 are formed, layers for forming the conductive adhesive film 3 and the insulating moisture-resistant film 4, respectively, are formed on the entire surface of the upper electrode layers 21 to 24. The layer for the conductive adhesive film 3 is formed of $TiO_x$ (x being a value smaller than 2), for example. The thickness of the layer for the conductive adhesive film 3 is between 5 and 10 nm, for example. The layer for the insulating moisture-resistant film 4 is a single layer made of $Al_2O_3$, SiN, $Ta_2O_5$, $SrTiO_3$, or the like, or any combination thereof, for example.

Portions of these layers for the conductive adhesive film 3 and the insulating moisture-resistant film 4 on top of the upper electrode layers 21 to 24 are removed via plasma etching or the like, thereby forming the patterned conductive adhesive film 3 and the patterned insulating moisture-resistance film 4 so as to allow the upper electrode layers 21 to 24 to be connected to the to-be-formed conductive layers 31 to 33. At the same time, the slit 71 is formed so that the patterned conductive adhesive film 3 and the insulating moisture-resistant film 4 have two separate regions contacting the lower electrode layer 10 and the lower electrode layer 11, respectively. This structure prevents leaks from occurring between the lower electrode layers 10 and 11.

After the conductive adhesive film 3 and the insulating moisture-resistant film 4 are formed, the interlayer insulation layer 5 that is a protective layer is formed. The interlayer insulation layer 5 is made of a polyimide, for example. The thickness of the interlayer insulation layer 5 is 3 µm, for example. As a result of the slit 71 being formed, the interlayer insulation layer 5 is connected to the thermal oxide film 2, adhesion is increased, and mechanical reliability is improved.

Then, respective portions of the interlayer insulation layer 5 above the upper electrode layers 21 to 24 are removed via plasma etching so as to allow the upper electrode layers 21 to 24 to be connected to the to-be-formed conductive layers 31 to 33. Before the conductive layers 31 to 33 are formed, however, a seed layer/conductive moisture-resistant film 81 is formed. The seed layer/conductive moisture-resistant film 81 is made of TaN (40 nm)/Ta (30 nm)/Cu (100 nm), for example. Instead of TaN/Ta, TiN, TiSiN, TaSiN, or other nitrides, $SrRuO_3$, $IrO_2$, or other oxides, or the like, may be used.

After the seed layer/conductive moisture-resistant film 81 is formed, a conductive layer for forming the conductive layers 31 to 33 is deposited. Various conductive materials such as Cu, Al, or the like, for example, can be used for the layer for the conductive layers 31 to 33. The thickness of the conductive layers 31 to 33 is 3 μm, for example.

After the layer for the conductive layers 31 to 33 is deposited, portions of the layer are removed via plasma etching or the like to define the patterned conductive layers 31 to 33 having respective desired shapes. Thereafter, an interlayer insulation layer 72 is formed. Similar to the interlayer insulation layer 5, the interlayer insulation layer 72 may be made of a polyimide, for example.

In order to form the terminal electrodes 41, 44, a portion of the interlayer insulation layer 72 is removed via plasma etching or the like, a seed layer/conductive moisture-resistant film 82 similar to the seed layer/conductive moisture-resistant film 81 is formed, and the conductive layers 57, 58 are formed. The conductive layers 57, 58 are formed via a conductive material such as Cu, for example, and have a thickness of 3 μm, for example.

The terminal electrodes 41, 44 are then formed on the conductive layers 57, 58. The terminal electrodes 41, 44 are made of Ni/Sn, for example, but may also be made of SnAg, Au, or a solder material. The terminal electrodes 41, 44 are made of Ni 2 μm/Sn 5 μm, for example.

Next, the cross section B-B' in FIG. 2 will be explained in more detail using FIG. 5.

The thermal oxide film 2 is formed on the supporting substrate 1, and the conductive adhesive film 3 and the insulating moisture-resistant film 4 are formed on the thermal oxide film 2. Resistance layers 15 to 17 are then formed on the insulating moisture-resistant film 4. The resistance layers 15 to 17 are made of a high resistance film such as a TaSiN, a NiCr alloy, a FeCrAl alloy, or the like, for example. The thickness of the resistance layers 15 to 17 is 100 nm, for example.

By plasma etching or the like, slits 71*a* and 71*b* are then formed in the conductive adhesive film 3 and the insulating moisture-resistant film 4.

As shown in this cross section, the conductive adhesive film 3 and the insulating moisture-resistant film 4 are separated into a left-hand side region and a right-hand side region via the slits 71*a* and 71*b*. Thus, the resistance layer 16 does not come into contact with the conductive adhesive film 3 or the insulating moisture-resistant film 4.

The interlayer insulation layer 5 is then formed, and the portion of the interlayer insulation layer 5 above the resistance layers 15 to 17 is removed via plasma etching or the like.

Next, the seed layer/conductive moisture-resistant film 81 is formed, and then the conductive layers 52, 53, 55, and 34 are formed. The conductive layers 52, 53, 55, and 34 are formed from the same material at the same time as the conductive layers 31 to 33 and have the same thickness as the conductive layers 31 to 33.

After the conductive layers 52, 53, 55, and 34 are formed, the interlayer insulation layer 72 is formed. The portion of the interlayer insulation layer 72 that is above the conductive layer 53 is removed via plasma etching or the like. Next, the seed layer/conductive moisture-resistant film 82 is formed, after which the conductive layer 59 is formed. The conductive layer 59 is formed of the same material at the same time as the conductive layers 57, 58 and has the same thickness as the conductive layers 57, 58. The terminal electrode 42 is formed on the conductive layer 59. The terminal electrode 42 is formed of the same material at the same time as the terminal electrodes 41, 44 and has the same thickness as the terminal electrodes 41, 44.

Figure 6:
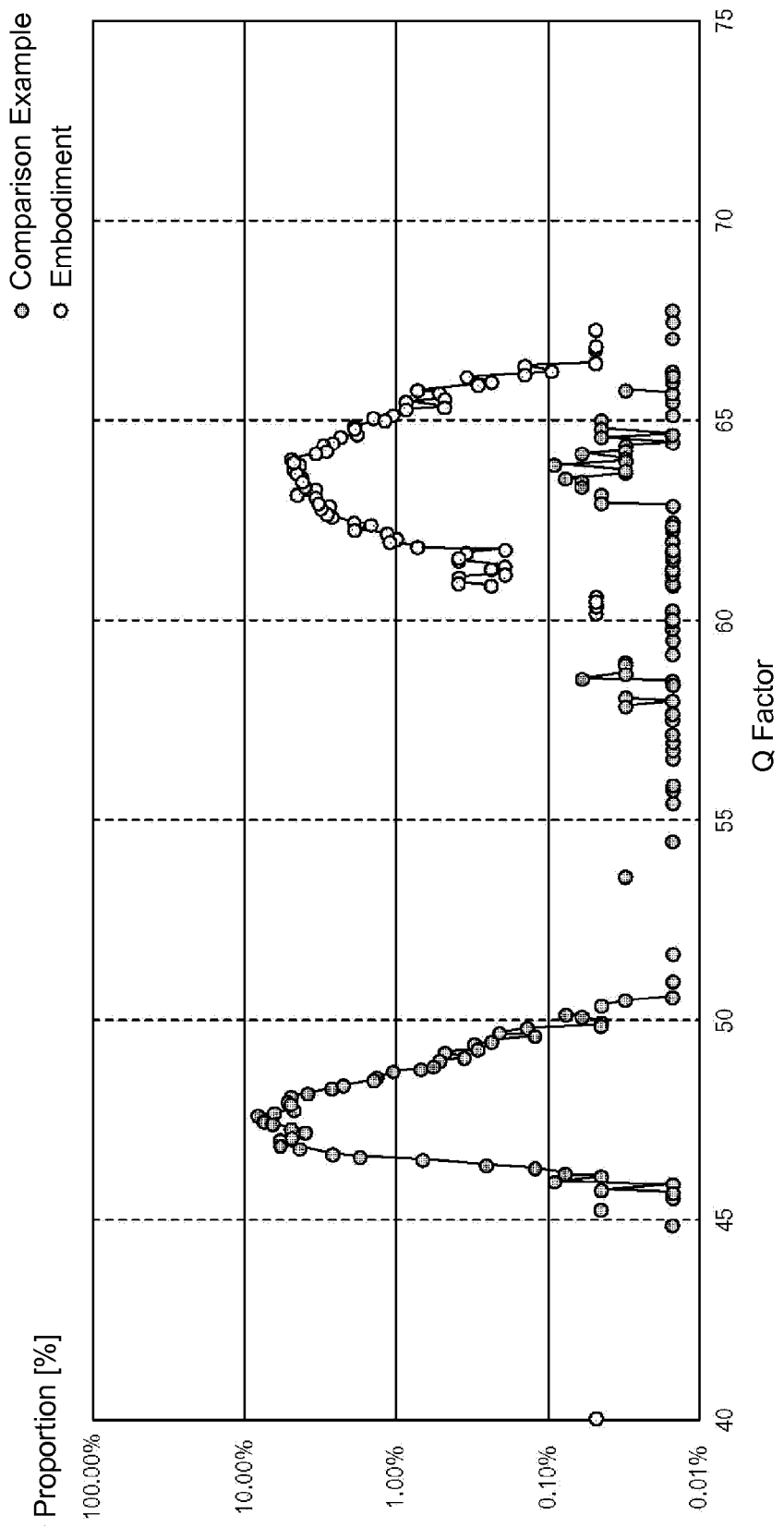
FIG. 6 is a graph for showing the effects of the embodiment.

The fact that using a variable capacitance device with such a structure improves the Q factor will be explained using FIG. 6. The horizontal axis of FIG. 6 represents the Q factor, and the vertical axis represents rate of occurrence (in %). Here, a prescribed number of variable capacitance devices having a configuration without slits 71 (comparison examples) were formed on a single wafer, and a prescribed number of variable capacitance devices according to the present embodiment that have slits 71 were formed on another wafer.

For the comparison examples, which did not have slits 71, variable capacitance devices with Q factors between 45 and 50 had the highest frequency of occurrence. While few in number, variable capacitance devices with high Q factors were also obtained.

On the other hand, for the variable capacitance devices according to the present embodiment that had slits 71, it can be seen that all such devices had Q factors of 60 or above and, as a whole, had higher Q factors than the comparison examples.

As mentioned above, according to the present embodiment, the Q factor can be increased, and mechanical reliability is increased as a result of improved adhesion between the interlayer insulation layer 5 and the supporting substrate 1.

In the example mentioned above, a variable capacitance device with four variable capacitance elements was used. However, the present invention is not limited to this; the number of variable capacitance elements included in a variable capacitance device may be a number other than four. In such cases, more than two lower electrode layers may be formed. Also, in the above-mentioned embodiment, two variable capacitance elements shared one lower electrode layer. However, the present invention is not limited to this; for each of the variable capacitance elements, a single lower electrode layer may be provided, depending on the design needs.

In such cases, slits 71 may be provided to isolate respective regions where the lower electrode layers are formed so as to separate the conductive adhesive film 3 and the insulating moisture-resistant film 4 into a plurality of regions. Thus, more than one slit may be appropriately provided. As also mentioned above, since such a configuration prevents leaks between the lower electrode layers and improves adhesion between the interlayer insulation layer 5 and the supporting substrate 1, the shape of the slits 71 may be modified in accordance with the shape of the lower electrode layer regions or the like.

Figure 7:
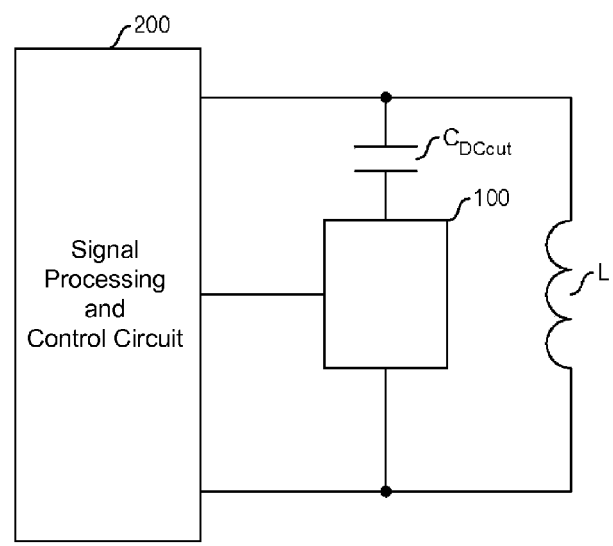
FIG. 7 illustrates an example of an antenna device according to one aspect of the present invention.

An antenna device that utilizes a variable capacitance device according to an embodiment of the present invention has a configuration shown in FIG. 7, for example. The antenna device has: a signal processing and control circuit 200, a capacitor $C_{DCcut}$ for cutting the DC, the variable capacitance device 100 according to an embodiment of the present invention, and a coil L used as an antenna. The signal processing and control circuit 200 is configured to apply the appropriate voltage to the variable capacitance device 100 so as to properly demodulate signals received by the coil L.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A variable capacitance device, comprising:
 a supporting substrate having a plurality of variable capacitance elements formed thereon, the plurality of variable capacitance elements being connected in series,
 wherein each of the plurality of variable capacitance elements comprises:
 a lower electrode formed over said supporting substrate;
 a dielectric formed on said lower electrode; and
 an upper electrode formed on said dielectric,
 wherein each of the plurality of variable capacitance elements has a separate lower electrode, or at least some of the plurality of variable capacitance elements share a lower electrode, thereby forming a plural set of the lower electrodes that serves as the lower electrodes of the respective variable capacitance elements,
 wherein the variable capacitance device further comprises an insulating moisture-resistant film and a conductive adhesive film that are formed after the upper electrodes for the respective variable capacitance elements have been formed, whereby the insulating moisture-resistant film and the conductive adhesive film are in layers that are positioned at a level higher than a layer in which the upper electrodes are formed, and
 wherein said conductive adhesive film and said insulating moisture-resistant film have a gap in a plan view between at least some of regions where said plural set of the lower electrodes are respectively formed so as to avoid electrical leakage between said at least some of regions through said conductive adhesive film.

2. The variable capacitance device according to claim 1, further comprising:
 an insulating layer formed on said insulating moisture-resistant film,
 wherein said insulating layer contacts a top surface of said supporting substrate at the gap of said conductive adhesive film and said insulating moisture-resistant film.

3. An antenna device, comprising:
 the variable capacitance device according to claim 1; and
 an antenna connected to the variable capacitance device.

* * * * *